United States Patent [19]

Kano et al.

[11] 3,794,421

[45] Feb. 26, 1974

[54] PROJECTED IMAGE VIEWING DEVICE

[75] Inventors: Ichiro Kano, Yokohama; Yu Yamada, Tokyo, both of Japan

[73] Assignee: Canon Kabushiki Kaisha, Tokyo, Japan

[22] Filed: Mar. 21, 1972

[21] Appl. No.: 236,686

[30] Foreign Application Priority Data

Mar. 22, 1971 Japan .......................... 46/4616313

[52] U.S. Cl. .............................................. 355/45
[51] Int. Cl. ........................................ G03b 13/26
[58] Field of Search.............................. 355/44, 45

[56] References Cited

UNITED STATES PATENTS 2,493,558 1/1950 Thompson .......................... 355/45
2,107,867 2/1938 Mayer................................. 355/44

*Primary Examiner*—John M. Horan
*Attorney, Agent, or Firm*—Toren and McGeady

[57] ABSTRACT

A projected image printing device in which a photo-sensitive plate on the surface of which printing is done is provided at an exit side of an imaging lens used for mask printing and has such exit pupil as being infinity or almost infinity, and at the same time a mask is positioned at incident side of said imaging lens at such position as being conjugate with the photo-sensitive plate, and also has an illuminating optical system to illuminate said mask.

9 Claims, 5 Drawing Figures

PROJECTED IMAGE VIEWING DEVICE

The present invention relates to a projected image viewing device which is used for alignment of a projected image of a mask in a projection printing device, etc.

It is necessary in preparation of integrated circuits to superimposedly print various kinds of negatives, that is masks, on a same wafer. In this case the pattern already printed on a wafer must have a mutually fixed positional relationship with the pattern of a mask to be printed next. For that end it is required to view the mask and the wafer simultaneously before printing for moving the mask or the wafer so that they can be placed in a desired positional relationship. This is called an alignment. On the other hand, as a means to print the mask on the wafer, a contact printing method has been used conventionally, but recently a projection printing method is used because of such advantages that the latter method will not scratch the mask and the wafer. The present invention pertains to a projected image viewing device used in an alignment of the projected image of a mask and a wafer in said projection printing process.

Figure 1:
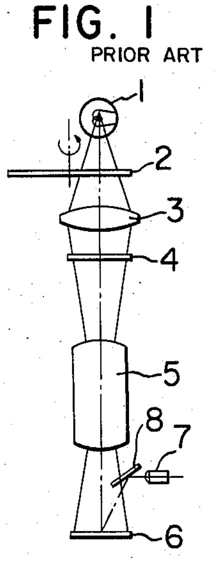
FIG. 1 PRIOR ART
Figure 2:
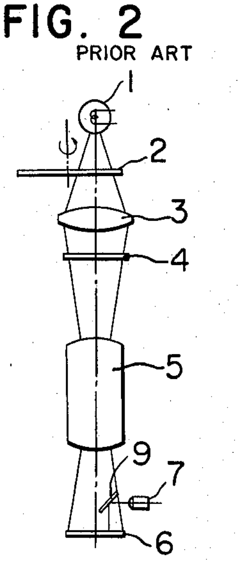
FIG. 2 PRIOR ART
Figure 3:
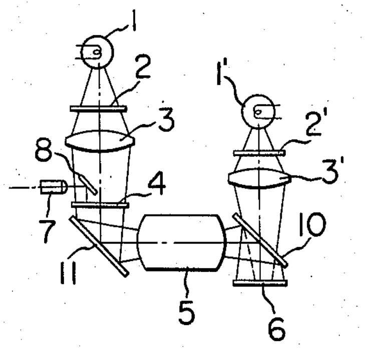
FIG. 3 PRIOR ART

Conventional method used in such alignment as mentioned above will be explained referring to its 3 examples shown in FIG. 1 through FIG. 3. In FIG. 1 through FIG. 3, 1 is a light source serving as illumination for printing and for alignment. 2 is a filter to prevent the wafer from being photo-sensitized at the time of alignment, and it also serves as a shutter in printing. 3 is a condensor lens, 4 is a mask, 5 is an imaging lens for printing, 6 is a wafer, 7 is an object lens for alignment, and 8 is a mirror. These components are indispensable for an alignment process in a projection printing device, in general, and in order to view the mask and the wafer at the same time, such method has been employed generally that either one of the mask and the wafer is directly viewed by an object lens for alignment while a projected image of the other one of the same through an imaging lens is viewed by the same object lens for alignment. In the example shown in FIG. 1, the wafer is viewed directly while a projected image through an imaging lens of the mask is viewed. Most troublesome problem in an alignment system is how an alignment device is positioned without obstructing an imaging optical path. In the example shown in FIG. 1, a wafer and a projected image of a mask are viewed from an oblique direction by a mirror 8 placed at a position being away from an optical path to avoid obstructing a mask imaging optical path. However, in this method since the wafer and the projected image of a mask are viewed in an oblique direction, the zone in which they are in focus is limited and the operating distance of the object lens for alignment needs to be made large, therefore there is such shortcoming that the multiplying power for viewing cannot be made large. FIG. 2 shows such system that the projected image of mask and the wafer are viewed through a thin semi-transparent mirror (pellicle mirror) which is provided within an optical path and has such thickness as not to give bad effect to a projected image, but said system has a shortcoming that such pellicle mirror as satisfying said requirements is difficult to make.

FIG. 3 shows such system that the effect by an alignment optical system over a projected image is, in principle, smallest. In the drawing, 1′, 2′, 3′ are a light source specifically intended for alignment, a filter, and a condensor lens, respectively. 10 is a dichroic mirror which transmits alignment light beam and reflects photographing light beam. 11 is a mirror to bend an optical axis of a projection lens by 90° to retain the mask surface in level. While in this system a mask 4 is viewed directly by a mirror 8 and a projected image on a wafer 6 is viewed by a mirror 10, since an alignment optical system is not positioned in an imaging optical path, no bad effect is given, in principle, to a projected image. However, as the dichroic mirror 10 and a mirror 11 are placed within an optical path of a projection lens, an error in the angle of mirror and surface accuracy of the same affects the projected image. At the same time as the supports within the lens 5 is apt to deform it by virtue of the effect of gravity. Further, as the alignment optical system and the wafer 6 are far from each other, it is inconvenient for their operation.

Now, the present invention is to solve the aforementioned problems, and its example will be explained in detail referring to FIG. 4 and FIG. 5.

Figure 4:
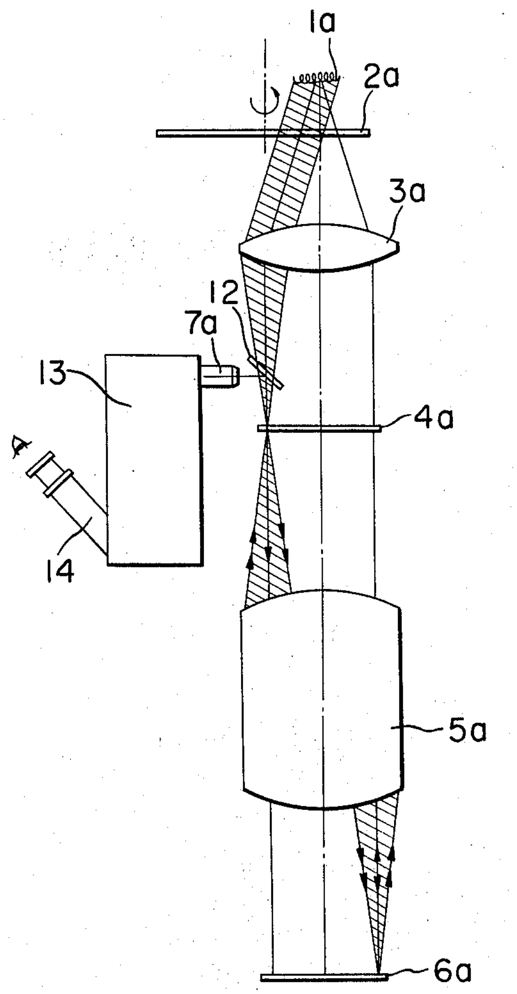
Figure 5:
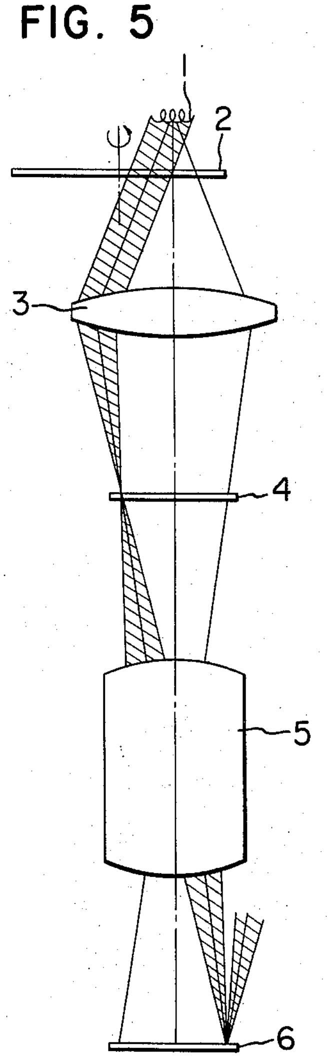

In FIG. 4, **1*a* is a light source both for printing and for alignment, provided with a switch-over means for the illuminating light for alignment and for the illuminating light for mask printing. 2*a* is a filter to prevent the wafer from being photographically exposed at the time of alignment, and may also serve as a shutter. 3*a* is a condensor lens, 4*a* is a mask, 5*a* is an imaging lens. In this invention, the image side (wafer side) of the imaging lens 5*a* is in a so-called telecentric condition, that is, an exit pupil is in a position of infinity from a wafer 6*a*. 6*a* is a reflective wafer provided at such position at exit side of the imaging lens 5*a* as being conjugate with the mask 4*a*. 7*a* is an object lens for alignment, 12 is a half mirror provided between said condensor lens 3*a* and the mask 4*a* to reflect light beam onto the object lens 7*a* in the alignment optical system, 13 is an optical device for directing the light from lens 7*a* to the eye of an observer, and 14** is an ocular part.

At the time of alignment in this device, a filter 2a limits the light beam flux coming out of the light source 1 to a range of wavelengths outside the range to which the wafer 6 is photosensitized. The light beam then illuminates the mask **4*a* through the condensor lens 3*a* and is made to image on the incident pupil of the projection lens 5*a***.

Since the exit pupil of the imaging lens 5a is at infinity, the illuminating light flux will become almost parallel with an optical axis as shown in FIG. 4 after coming out of the imaging lens and will enter vertically into the wafer, while it will come back to original direction when being reflected by the wafer. Thus sufficient amount of light reaches the mirror 12 in the alignment optical system and bright alignment optical system can be obtained. FIG. 5 shows a case when the exit pupil of the imaging lens is not in infinity, wherein the illuminating light beam is apparently not reflected to original direction by the wafer, therefore only a portion of the light beam flux will be returned to the projection lens. Therefore sufficient light will not reach alignment optical system and viewing will become difficult.

As has been explained above, in the present invention the wafer and the projected image of the mask can be viewed and alignment can be obtained. And as such imaging lens as having an exit pupil being at the position of infinity is used in the present invention, sufficient amount of reflective light from the projected image can be obtained at the alignment optical system so that bright image can be viewed, and at the same time as the alignment half mirror 12 is not in the imaging optical path of the imaging lens, no bad effect is given to the projected image. At the same time a vertical arrangement of the imaging lens can be made possible, therefore such printing device can be realized because the lens assembly is not distorted and alignment and printing operation is good. While the present invention is intended for so-called mask alignment in preparation of integrated circuits, the present invention is not limited to this application, instead it may be applied to various other purposes.

What is claimed is:

1. A projected image printing device in which a photo-sensitive plate on the surface of which printing is done is provided at an exit side of an imaging lens used for mask printing and having an exit pupil adjusted substantially to infinity, said lens being focused on said plate, and at the same time a mask is positioned at an incident side of said imaging lens at a position conjugate with the photo-sensitive plate, and an illuminating optical system to illuminate said mask.

2. A device as in claim 1, in which a beam splitter is provided between the mask and the illuminating optical system to split the beam, and an alignment optical system is in the path of a portion of the split beam so the portion enters the alignment optical system.

3. A device as in claim 1, in which the photo-sensitive plate consists of a photosensitive plate of reflective nature.

4. A device as in claim 1, in which the illuminating optical system contains a filter device to prevent the exposing the photo-sensitive plate at the time of alignment.

5. An apparatus for printing images onto a sensitized surface, comprising image-containing means forming the image to be printed, illuminating means for illuminating the image-containing means, lens means for projecting light from the illuminated image-containing means onto the sensitized surface , said lens means being telecentric ahd having an exit pupil substantially at infinity so that the principal rays travel along substantially parallel lines.

6. An apparatus for detecting the alignment of an image of an integrated circuit with a photosensitized surface of a semiconductor upon which the image is to be printed and for printing the image prior to etching it, comprising mask means containing the image to be printed, illuminating means for illuminating the mask means, lens means for projecting light from the illuminated image onto the photosensitized surface of the semiconductor, image sampling means in the path of light between said illuminating means and said lens means for simultaneously sensing an image from said mask means and a picture of the resulting image formed on the photosensitized surface as the resulting image is projected back through said lens means, said lens means being positioned relative to said mask means and having a structure such that the lens means having an exit pupil substantially at infinity with the principal rays striking the surface travels in substantially parallel lines, said surface and said mask means being in substantially conjugate relationship with respect to said lens means.

7. An apparatus as in claim 6, wherein said image sampling means is positioned between said mask means and said illuminating means.

8. An apparatus as in claim 6, wherein said image sampling means includes a semi-transparent mirror for allowing a portion of the light passing toward said lens means to continue and for diverting a portion of the light from said mask means and said lens means transverse to the light passing through said lens means.

9. The method of detecting the alignment of an image with the sensitized surface upon which the image is to be printed, which comprises illuminating the source of the image, projecting the light from the source with a lens onto the the sensitized surface, sampling a portion of the light returning from the sensitized surface through the lens and the light from the source of the image simultaneously so as to superpose the light from the source with the light from the photosensitive surface, the step of projecting the light from the source with the objective lens including the step of projecting the light so that the principal rays leave the objective lens along substantially parallel lines and are focused substantially on infinity.

* * * * *